June 18, 1968 GEORGE T. KUWAYAMA ET AL 3,388,811

MEMORY DEVICE FOR DETECTING THE LOCATION OF AN ARTICLE

Filed Oct. 19, 1965

INVENTORS
G. T. KUWAYAMA
F. WAHL
BY N. A. Addams
ATTORNEY

United States Patent Office 3,388,811
Patented June 18, 1968

3,388,811
MEMORY DEVICE FOR DETECTING THE LOCATION OF AN ARTICLE

George T. Kuwayama, Scotch Plains, and Frank Wahl, North Bergen, N.J., assignors to Western Electric Company, Incorporated, New York, N.Y., a corporation of New York Filed Oct. 19, 1965, Ser. No. 498,033
12 Claims. (Cl. 214—1)

ABSTRACT OF THE DISCLOSURE

Means for locating a very small and fragile article in a desired position in a manufacturing fixture, which fixture includes a housing having a chamber. A plurality of ducts connect the chamber with the housing exterior. The terminating ends of the ducts are arrayed in a predetermined pattern corresponding to the perimeter of the article. A piston-like member is supported in the chamber, and has one end exterior of the housing. When the article is in the desired location in the fixture, it covers all the terminating ends of the ducts, thereby sealing the chamber from the atmosphere. The chamber is evacuated which moves the piston-like member to a position which indicates that the article is in its desired location for movement of the fixture to a processing station for working on the article.

This invention relates to a memory device, and more particularly to a vacuum-operated memory pin device for detecting the accurate location of a delicate wafer-like article thereon and for controlling the operation of a work station in response to such accurate location.

One type of electrical capacitor, known as a silvered-mica capacitor, comprises a plurality of stacked delicate mica wafers on which silver stripes are applied. In one apparatus presently used to automatically manufacture these capacitors, a carrier sequentially advances work holders which contain the wafers to a plurality of work stations. It is desirable to prevent the mechanism at the work station where the silver stripes are applied from operating when an empty holder, or a holder having an improperly positioned wafer thereon, is advanced to it. The presently used apparatus employs a probe-type detector to detect whether a wafer is properly positioned on the holder. If the wafer is properly positioned, the probe contacts the wafer and actuates a circuit which operates the stripe applying mechanism. If a wafer is missing from or improperly positioned on the holder, the probe actuates circuitry to render inoperative the stripe applying mechanism.

These wafers are relatively very delicate and small, on the order of 0.375 inch by 0.500 inch and 0.0012 inch thick, consequently, the silver strips must be accurately positioned on the wafer. It follows that each wafer must be accurately located on the holder. Since these wafers are very delicate, they should not be touched by human hands and by such implements as the above-described probe-type detector, in order to prevent contamination of and damage to the wafers. Therefore, there is a need for a device for detecting the accurate location of these wafers on the holders and for controlling the operation of the stripe applying mechanism, such that the wafers are not touched or contaminated in any manner during and after their accurate location on the holders.

Accordingly, an object of this invention is to provide a new and improved memory device.

Another object is to provide a vacuum-operated memory pin device for detecting the accurate location of a delicate wafer-like article thereon and for controlling the operation of a work station in response to such accurate location. A related object is such a memory pin device wherein the accurate location of the article is detected without the article being touched by human hands, probe-type devices, or the like.

With these and other objects in view, a memory device, illustrating certain principles of the invention, includes a housing which has a chamber contained therein. A plurality of channels or air ducts extend through the walls of the housing to the chamber, the ducts being arranged in a predetermined pattern to define the perimeter configuration of a wafer-like article. The chamber is connected to a vacuum source. A pin extends through two opposite walls of the housing and through the chamber. When an article is accurately located over the ducts, the chamber is closed off from the media surrounding the housing and is evacuated by the vacuum source. This action creates a pressure differential on a surface of the pin within the chamber to move the pin to a predetermined position.

Other objects and advantages of the invention will become apparent by reference to the following detailed specification and accompanying drawings, wherein.

Figure 3:
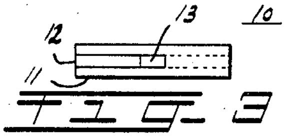
FIGS. 3 and 4 are plan and side views, respectively, of a wafer having stripes thereon, the wafer to be accurately located on the memory pin device of the invention and transported to the various work stations of the apparatus shown in FIG. 2.
Figure 4:
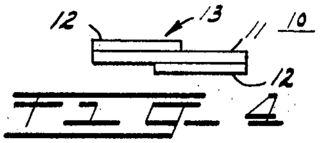

Referring to FIGS. 3 and 4, there is shown a sheet 10 comprising a delicate wafer 11, made of mica or other suitable dielectric material, on which a stripe 12 of silver, or other suitable conductive material, is applied to each side of the wafer. A plurality of sheets 10 are stacked to assemble capacitors of very accurate value. In the manufacture of one capacitor by the Western Electric Company, wafer 11 is 0.375 inch by 0.500 inch and 0.0012 inch thick.

Stripes 12 must be accurately aligned in a longitudinal direction and a predetermined portion of each stripe 12 must overlap at point 13. The thickness of wafer 11 and the area of overlap 13 of stripes 12 are some of the factors which determine the amount of capacitance for a sheet 10. Because of the criticality of the placement of stripes 12 on wafer 11 and the delicateness of wafer 11, it is necessary that wafer 11 not be touched by human hands or probe-type devices which may contaminate or damage the wafer.

Figure 1:
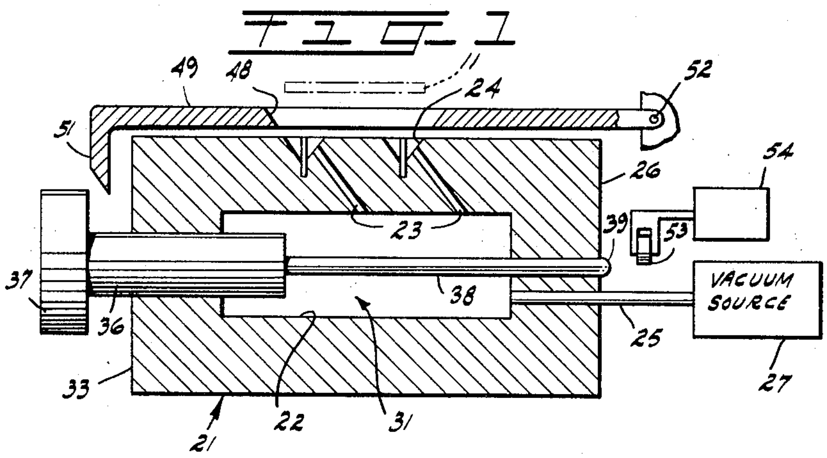
FIG. 1 is a cross-sectional view of a memory pin device, incorporating certain principles of the invention.

Referring to FIG. 1, there is shown the memory pin device which includes a housing 21 containing a chamber 22. A plurality of channels or ducts 23 are formed through the top wall of housing 21 and terminate in opening 24 to connect chamber 22 with the media surrounding housing 21. The media, by way of example, may be the atmosphere, a gas, liquid, or the like. Apertures 24 are arranged in a predetermined pattern corresponding substantially to the perimeter configuration of wafer 11. When wafer 11 is accurately located over apertures 24, chamber 22 is closed off from the atmosphere. An opening 25 is formed in one wall 26 of housing 21 and interconnects chamber 22 with a vacuum source 27.

A pin 31 extends through opposite walls 26 and 33 of housing 21. Pin 31 includes a first shank portion 36 which is slidable through an opening in wall 33. A head 37 is mounted on the portion of shank 36 exterior of housing 21. Pin 31 also includes a second shank portion 38 connected to shank 36, but of a diameter less than that of shank 36. Shank 38 is slidable through an opening in wall 26 and has a tip 39 formed on its end exterior of housing 21.

In operation of the memory pin device of the invention, wafer 11 is accurately located over apertures 24 to close off chamber 22 from the atmosphere. Vacuum source 27 then evacuates chamber 22, to create a pressure differential which acts on the intersection of shanks 36 and 38 within chamber 22. This action moves pin 31 to the right as seen in FIG. 1. Tip 39 of shank 38 is now in a position to operate a switch, a cam, or the like.

The memory pin device of this invention serves the dual function of (1) detecting the accurate location of wafer 11 over apertures 24, and (2) storing the information that wafer 11 is so located; that is, the memory function is performed by tip 39 being moved to the right. Obviously, if wafer 11 is not present or is not accurately located so that one or more apertures 24 are not covered, chamber 22 is not closed off from the atmosphere. Consequently, pin 31 is not moved to the right.

Figure 2:
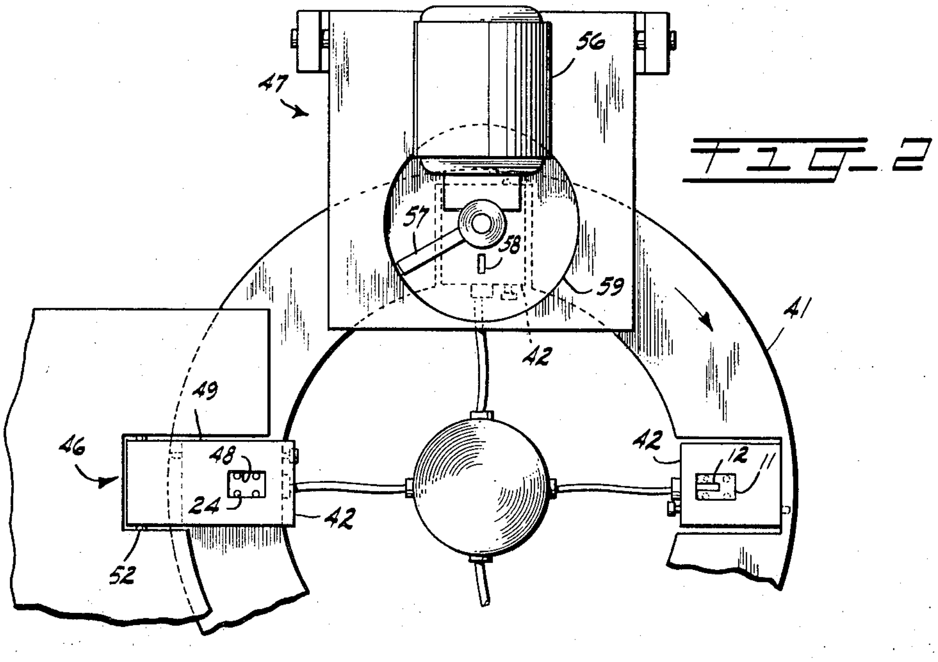
FIG. 2 is a diagrammatical representation of a portion of an apparatus in which the memory pin device of the invention may be used.

Referring to FIG. 2, there is shown a portion of an apparatus for manufacturing sheets 10 with which the memory pin device of this invention may be used. The apparatus includes a turntable 41 having mounted thereon several memory pin devices 42, three of which are shown. Memory pin devices 42 are indexable from work station 46 to work station 47.

When memory pin device 42 is located at work station 46, wafer 11 is deposited in an opening or nest 48 formed in a plate 49 which is hinged about a pin 52, (FIGS. 1 and 2), for example by an operator using a vacuum needle pickup. Nest 48 has slanted walls (FIG. 1) which terminate in the exact perimeter configuration of wafer 11; thus, wafer 11 is accurately located over apertures 24 when it falls through nest 48. If wafer 11 is accurately located over apertures 24, vacuum source 27 evacuates chamber 22 and pin 31 is moved to the right (FIG. 1). When pin 31 is moved to the right, head 37 of pin 31 strikes a cam 51 (FIG. 1) on plate 49 to pivot the plate about pin 52. This action raises plate 49 and prevents it from touching wafer 11 when turntable 41 is indexed to work station 47.

When pin 31 is moved to the right, tip 39 thereof also is moved to the right. Thus, when memory pin device 42 is indexed to work station 47, tip 39 actuates a switch arm 53 of a switch 54 (FIG. 1) to energize a motor 56. Motor 56 drives a rotary squeegee arm 57 to apply a stripe 12 of silver through a window 58 in a mask 59 onto one side of wafer 11.

It can be seen that, due to the small size of wafer 11 and the necessity of exact placement of stripe 12 on wafer 11, it is imperative that memory pin device 42 position wafer 11 in a precise position under window 58. It follows that wafer 11 must be placed in an accurate location on memory pin device 42. The problem of locating wafer 11 on memory device 42 is fully appreciated, when it is realized that a second stripe 12 is later applied to the other side of wafer 11 such that stripes 12 overlap a precise amount at point 13 (FIGS. 3 and 4).

If wafer 11 had not been located on or improperly located on memory pin device 42, pin 31 would not have been moved to the right and motor 56 would not have been energized. Consequently, arm 57 would not have been rotated to apply silver through window 58 in mask 59.

In the above-described use of the memory pin device of the invention, memory pin device 42 performs the detector function of detecting the accurate location of wafer 11 over apertures 24 and the memory function of storing the information that wafer 11 is so located, thereby controlling the operation of station 47.

Although the memory pin device has been described in the context of accurately locating a delicate rectangular wafer thereon, it will be obvious to one skilled in this art that wafer 11 may be any shape other than rectangular. Also, the memory pin device has general applicability for detecting the location of delicate articles thereon and performing a memory function in response to such location in uses other than the manufacture of striped wafers for stacked capacitors.

It is to be understood that the above-described embodiment is merely illustrative of the principles of the invention and other embodiments of the device may be devised without departing from the scope of the invention.

What is claimed is:

1. A memory pin device for locating an article, comprising:
- a housing containing a chamber and having ducts formed therethrough to connect the chamber to the media surrounding the housing, the ducts being arranged in a predetermined pattern corresponding to the perimeter outline of the article,
- means for evacuating said chamber when all the ducts are covered by the article to establish a pressure differential between said chamber and exterior media, and
- a pin extending through certain walls of the housing and through the chamber, the pin being moved to a predetermined memory position in response to evacuation of said chamber when all the ducts are covered by the atricle to close off the chamber from the surrounding media.

2. The memory pin device, according to claim 1, wherein the pin includes a first shank of first cross sectional dimensions connected to a second shank of second cross sectional dimensions, whereby a pressure differential is created at the intersection of the first and second shanks within the chamber to move the pin when the chamber is evacuated.

3. The memory pin device according to claim 2, wherein the pin has a circular cross section.

4. A memory pin device comprising:
- a housing containing a chamber and having ducts formed therethrough to connect the chamber to the media surrounding the housing, the ducts being arranged in a predetermined pattern,
- a pin extending through certain walls of the housing and through the chamber, the pin being moved to a predetermined position when the ducts are covered to close off the chamber from the surrounding media and the chamber is evacuated, and
- means for locating an article in a predetermined location over the ducts including a plate pivotably mounted adjacent the housing where the ducts are formed, an opening being formed through the plate in a position over the ducts.

5. The memory pin device according to claim 4, wherein the pin has a head formed thereon exterior of the housing for pivoting the plate when the pin is moved to the predetermined position by the evacuation of the chamber.

6. The memory pin device according to claim 4, wherein the opening in the plate has slanted walls which terminate substantially in the perimeter outline of the article.

7. In a memory device for detecting the accurate location of a flat article, such as a wafer, to be advanced to a work station and for controlling the operation of the work station in response to the wafer location,
- a housing,
- a vacuum source,
- a chamber contained within the housing and being connected through an opening in the housing to the vacuum source,
- a plurality of air ducts extending through the housing to the chamber, the ducts terminating in a predetermined pattern substantially corresponding to the perimeter configuration of the wafer,
- a pin extending through a pair of opposed walls of the housing and through the chamber, the pin including a first shank which extends out of one wall and a reduced diameter second shank which extends out of the opposite wall of the housing, the intersection of the first and second shanks being within the chamber, and a plate having a nest formed therethrough, the nest having walls which terminate substantially in the perimeter configuration of the wafer and being aligned with the predetermined pattern of the duct terminations, whereby the nest guides the wafer accurately over the duct terminations to close the chamber to the atmosphere, thereby causing the vacuum source to evacuate the chamber for moving the pin to a predetermined position to operate a control mechanism of the work station.

8. The memory pin device according to claim 7, wherein the pin has a head formed on the first shank exterior of the housing for pivoting the plate when the pin is moved to the predetermined position.

9. Apparatus for locating an article in a desired position comprising:

a housing containing a chamber and having ducts for connecting said chamber to an exterior region, said ducts having a predetermined pattern corresponding to the perimeter of the article, a member movable in response to a pressure differential between said chamber and said exterior region, said member being movable to a first position in response to the article being located over all of the ducts, such positioning of the article closing off said chamber from said region, and means for creating the pressure differential by evacuating said chamber when all of said ducts are covered by the article, thereby causing said member to move to its first position which is an indication that the article is in a desired location on said housing.

10. Apparatus as defined in claim 9 wherein said member has first and second portions located respectively in said chamber and the exterior region which makes said member movable in response to the pressure differential.

11. Apparatus as defined in claim 9 wherein said housing is part of a manufacturing fixture and said apparatus further includes:

means responsive to the movement of said member to its first position for operating a control mechanism when the article is properly located on said fixture housing.

12. Apparatus for locating an article in a desired position in a manufacturing fixture comprising:

a housing containing a chamber and having ducts formed therethrough for connecting said chamber to the housing exterior, said ducts having terminating ends in a predetermined pattern corresponding to the perimeter of the article, means for evacuating said chamber when all of said terminating ends are covered by the article to establish a pressure differential between said chamber and said housing exterior, and a movable member extending through said housing and into said chamber, said member having a portion thereof exterior of said housing and a face in said chamber making said member responsive to the pressure differential between said chamber and the housing exterior, said member being movable to a first position and held thereat while the article is located over all the terminating ends of said ducts, such positioning of said article closes off the chamber from the housing exterior, and movement of said member to its first position being an indication that the article is in a desired location on said fixture.

References Cited

UNITED STATES PATENTS

| | | | |
|---|---|---|---|
| 650,355 | 5/1900 | Hesse | 60—60 |
| 2,239,613 | 4/1941 | Martin. | |

ROBERT G. SHERIDAN, *Primary Examiner.*

GERALD M. FORLENZA, *Examiner.*

F. E. WERNER, *Assistant Examiner.*